(12) United States Patent
Takakusaki et al.

(10) Patent No.: US 8,231,728 B2
(45) Date of Patent: Jul. 31, 2012

(54) EPITAXIAL GROWTH PROCESS

(75) Inventors: Misao Takakusaki, Toda (JP); Susumu Kanai, Toda (JP)

(73) Assignee: Nippon Mining & Metals Co., Ltd., Tokyo (JP)

( * ) Notice: Subject to any disclaimer, the term of this patent is extended or adjusted under 35 U.S.C. 154(b) by 416 days.

(21) Appl. No.: 10/563,105

(22) PCT Filed: Apr. 28, 2004

(86) PCT No.: PCT/JP2004/006144
§ 371 (c)(1),
(2), (4) Date: Dec. 30, 2005

(87) PCT Pub. No.: WO2005/006421
PCT Pub. Date: Jan. 20, 2005

(65) Prior Publication Data
US 2006/0178000 A1 Aug. 10, 2006

(30) Foreign Application Priority Data
Jul. 15, 2003 (JP) ................................. 2003-274441

(51) Int. Cl.
*C30B 25/00* (2006.01)
(52) U.S. Cl. ................ 117/93; 117/84; 117/88; 117/89; 117/102; 117/105; 117/950; 117/953; 117/954; 117/955
(58) Field of Classification Search .................... 117/84, 117/88, 89, 93, 102, 105, 950, 953, 954, 117/955
See application file for complete search history.

(56) References Cited

U.S. PATENT DOCUMENTS

| 6,206,969 B1 * | 3/2001 | Takahashi et al. ............ 118/715 |
| 6,229,162 B1 * | 5/2001 | Watanabe ..................... 257/186 |
| 2003/0141518 A1 * | 7/2003 | Yokogawa et al. ........... 257/194 |

FOREIGN PATENT DOCUMENTS

| JP | 64073715 | * | 3/1989 |
| JP | 1-315128 A | | 12/1989 |

(Continued)

OTHER PUBLICATIONS

Patent Abstracts of Japan. English Abstract and Computer translation of JP 07-086162A (1995).*

(Continued)

*Primary Examiner* — Matthew Song
(74) *Attorney, Agent, or Firm* — Birch, Stewart, Kolasch & Birch, LLP

(57) ABSTRACT

An epitaxial growth method forming a semiconductor thin film including a heterojunction of a group III-V compound semiconductor by means of molecular beam epitaxy. The method is configured to include: a first step of irradiating a molecular beam of at least one of group III elements and a molecular beam of a first group V element to form a first compound semiconductor layer; a second step of stopping the irradiation of the molecular beam of the group III element and the molecular beam of the first group V element to halt growth until an amount of the first group V element supplied is reduced to 1/10 or less of a supply of the first group V element in the first step; and a third step of irradiating a molecular beam of at least one of the group III elements and a molecular beam of a second group V element to form a second compound semiconductor layer, which is different from the first compound semiconductor, on the first compound semiconductor layer.

4 Claims, 4 Drawing Sheets

FOREIGN PATENT DOCUMENTS

| | | |
|---|---|---|
| JP | 4-252019 A | 9/1992 |
| JP | 6-97097 A | 4/1994 |
| JP | 7-86162 A | 3/1995 |
| JP | 07-086162 A * | 3/1995 |
| JP | 08017739 A * | 1/1996 |
| JP | 11-266009 A | 9/1999 |
| JP | 2001-93838 A | 4/2001 |

OTHER PUBLICATIONS

Patent Abstracts of Japan. English Abstract of JP 64-073715 (1989).*

Office Action issued in counterpart Taiwanese Application No. 93119843 on Nov. 27, 2009, and English translation thereof.

Mi et al., "Improvement of optical and electronic properties in broken gap mid-wave infrared laser materials," Conference on Lasers and Electro-Optics (CLEO 2001), Technical Digest, Postconference Edition, Baltimore, Md., May 6-11, 2001 [Trends in Optics and Photonics, (Tops)], US Washington, WA: OSA, US. vol. 56, pp. 486-487, XP010560097.

Harper et al., "Cross-sectional scanning tunneling microscopy characterization of molecular beam epitaxy grown InAs/GaSb/AlSb heterostructures for mid-infrared interband cascade lasers," Journal of Vacuum Science & Technology B: Microelectronicsprocessing and Phenomena, American Vacuum Society, New York, NY, US, vol. 16, No. 3, May 1, 1998, p. 1389-1394, XP012006832.

Hasenberg et al., "Molecular beam epitaxy growth and characterization of broken-gap (type II) superlattices and quantum wells for midwave-infrared laser diodes," Journal of Vacuum Science & Technology B: Microelectronicsprocessing and Phenomena, American Vacuum Society, New York, NY, US, vol. 18, No. 3, May 1, 2000, pp. 1623-1627, XP012008258.

Desalvo et al., "Citric Acid Etching of $GaAs_{1-x}Sb_x$, $Al_{0.5}Ga_{0.5}Sb$, and InAs for Heterostructure Device Fabrication," Journal of the Electrochemical Society, Electrochemical Society, Manchester, New Hampshire, US, vol. 141, No. 12, Dec. 1, 1994, pp. 3526-3531, XP000495786.

Office Action dated Mar. 9, 2010 issued in counterpart Japanese Application No. 2005-511461.

Office Action dated Feb. 5, 2010 issued in counterpart European Application No. 04 730 022.3-2203.

European Office Action issued on Oct. 13, 2010 in connection with corresponding European Application No. 04730022.3 (in English).

Japanese Office Action dated Nov. 1, 2011 issued in counterpart Japanese Application No. 2010-187972 (with partial English translation).

* cited by examiner

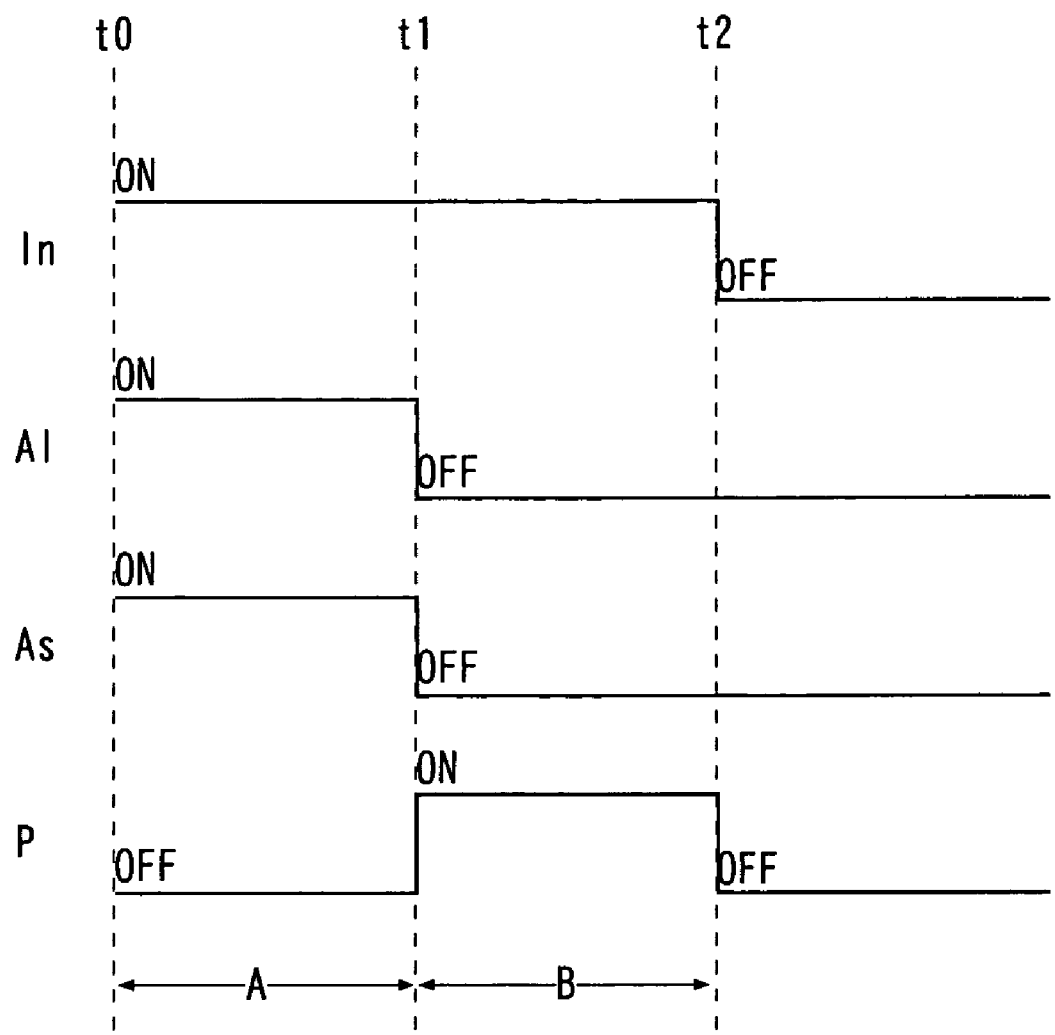

EPITAXIAL GROWTH PROCESS

TECHNICAL FIELD

The present invention relates to a method of forming a group III-V compound semiconductor thin film including a heterojunction interface, and specifically, relates to an epitaxial growth method suitable for manufacturing a high electron mobility transistor (HEMT) using an InP layer as an etch stopper layer (an etching control layer).

BACKGROUND ART

Epitaxial crystal of a high electron mobility transistor (hereinafter, abbreviated to a HEMT) structure has hitherto been composed of a group III-V compound semiconductor thin film formed by metal organic chemical vapor deposition (MOCVD) or molecular beam epitaxy (MBE). For example, a structure has been proposed, in which semiconductor layers including an InAlAs layer and an InGaAs layer are stacked on an InP substrate and an InP layer is further formed as an etch stopper layer. FIG. 6 shows a basic configuration of this HEMT structure including the etch stopper layer composed of the InP layer.

The HEMT structure shown in FIG. 6 includes an undoped InAlAs layer (buffer layer) 102, an undoped InGaAs layer (channel layer) 103, an undoped InAlAs layer (spacer layer) 104, an n-type impurity doped InAlAs layer (electron supply layer) 105, an undoped InAlAs layer (spacer layer) 106, an undoped InP layer (etch stopper layer) 107, an n-type impurity doped InAlAs layer (resistance reducing layer) 108, and an n-type impurity doped InGaAs layer (resistance reducing layer) 109, which are stacked on a semi-insulating substrate 101 made of InP.

The n-type InAlAs layer 108 and n-type InGaAs layer 109 are individually divided by etching. The InP layer 107 is exposed in the etched area. On individual divided parts of the InGaAs layer 109, ohmic electrodes 110 and 111, each of which serves as a source or drain electrode, are formed. On the exposed part of the InP layer 107, a Schottky electrode, which serves as a gate electrode, is formed.

In the above described HEMT structure, etching rate (phosphoric acid or citric acid type etchant) of the InP layer 107 is several tenths or several hundredths of etching rate of the InAlAs layer 108 or InGaAs layer 109. Accordingly, the InP layer 107 is less eroded by the etchant and can provide very high selectivity. The InP layer 107 therefore plays a role in preventing that etching proceeds to the InAlAs layers 105 and 106 under the InP layer 107 to degrade device characteristics of the HEMT such as high frequency characteristics.

In the above described HEMT structure, heterojunction interfaces (hereinafter referred to as heterointerfaces) between materials including different group V elements are formed between the InAlAs layers 106 and 108 and the InP layer 107. In such a device utilizing heterojunction, device characteristics are greatly affected by steepness and flatness of an atomic composition distribution in the heterointerface. For example, in forming this heterointerface, when As is mixed into the InP layer 107 or a transition layer with As and P mixed is formed in the interface because of bad forming conditions, the selectivity of the InP layer 107 as the etch stopper layer is significantly reduced in some cases.

Moreover, when the InP layer 107 is used as the etch stopper layer, it is better that the InP layer 107 is made thinner, and the thickness thereof is usually configured to be about 3 to 6 nm. When the InP layer 107 is formed to be very thin like this, forming conditions of particularly the heterointerface greatly affects the selectivity of the InP layer 107, and optimization of the forming conditions of the heterointerface is therefore important.

As for the formation of the HEMT by MOCVD, supplies of raw material gases for growing the InP layer 107 are adjusted so that density of etched portions of the InP layer 107 is equal to or less than a predetermined value during etching of the InAlAs layer 107, InGaAs layer 108, and the like (for example, JP Hei11-266009A).

In the formation of the HEMT by MBE, irradiation of molecular beams of raw material elements is controlled according to formation of each semiconductor layer by turning on and off shutters and valves provided for respective molecular beam sources. FIG. 7 is a timing diagram showing a procedure of supplying raw materials when a heterointerface between the InAlAs layer and the InP layer is formed by a conventional epitaxial growth method. In step A, molecular beams of In, Al, and As are irradiated to form the InAlAs layer, and in step B, molecular beams of In and P are irradiated to form the InP layer. The In molecular beam is irradiated without being stopped, and irradiation of the As molecular beam and irradiation of the P molecular beams are simultaneously switched to each other. The InAlAs layer and InP layer are thus continuously formed.

At this time, it is assumed that the supplied molecular beams is instantaneously switched since the MBE does not include gas flow unlike the MOCVD. In fact, in terms of a molecular beam of a group III element (for example, Al molecular beam), it has been confirmed that intensity of the molecular beam supplied to the substrate in the step B is not more than 1% corresponding to driving time (usually not more than 1 second) of the shutter.

On the other hand, it has been found that the group V element (As) is easily mixed when the heterointerface is formed because the vapor pressure of the group V element is higher than that of the group III element and molecules thereof remained in a growth chamber even after the supply of the molecular beam is stopped. However, growth conditions (forming conditions of the heterointerface) were determined without any reference to these remaining group V molecules. Accordingly, when opening and closing speed of the valves of the molecular beam sources or the operation states of the shutters changed, the characteristics of the heterointerfaces between the InAlAs and InGaAs layers and the InP layer slightly changed corresponding to the amounts of the remaining group V elements (molecular beam intensities of the remaining group V elements). Moreover, there was a disadvantage that the selectivity was lowered when the InP layer as the etch stopper layer of the HEMT was formed in such a manner.

In order to solve the aforementioned problem, the present invention was made with focusing attention on the amounts of the group V elements remaining at switching of the group V elements in epitaxial growth by MBE. An object of the present invention is to propose an epitaxial growth method achieving formation of a heterointerface with stable characteristics and thus achieving formation of an InP etch stopper layer with high selectivity.

DISCLOSURE OF THE INVENTION

An aspect of the present invention is an epitaxial growth method to form a semiconductor thin film including a heterojunction of a group III-V compound semiconductor by means of molecular beam epitaxy. The method is configured to include: a first step of irradiating a molecular beam of at least one of group III elements and a molecular beam of a first group V element to form a first compound semiconductor layer; a second step of stopping the irradiation of the molecular beam of the group III element and the molecular beam of the first group V element to halt growth until an amount of the first group V element supplied is reduced to $\frac{1}{10}$ or less of that in the first step; and a third step of irradiating a molecular beam of at least one of the group III elements and a molecular beam of a second group V element to form a second compound semiconductor layer, which is different from the first compound semiconductor, on the first compound semiconductor layer. This allows the amount of the first group V element mixed into the second compound semiconductor layer to be not more than a predetermined value (for example, not more than 0.05 by composition).

Another aspect of the present invention is an epitaxial growth method to form a semiconductor thin film including a heterojunction of a group III-V compound semiconductor by means of molecular beam epitaxy. The method is configured to include: a first step of irradiating a molecular beam of at least one of group III elements and a molecular beam of a first group V element to form a first compound semiconductor layer; a second step of stopping the irradiation of the molecular beam of the group III element and the molecular beam of the first group V element and irradiating a molecular beam of a second group V element to halt growth until an amount of the first group V element supplied is reduced to $\frac{1}{10}$ or less of that in the first step; and a third step of further irradiating a molecular beam of at least one of the group III elements to form a second compound semiconductor layer, which is different from the first compound semiconductor, on the first compound semiconductor layer. Here, in the second step, while the molecular beam of the group V element is irradiated, the molecular beam of the group III element is not irradiated, thus the growth of the epitaxial layer is halted. In the third step, therefore, the second group V element can be supplied with desired molecular beam intensity from the beginning of the formation of the second compound semiconductor layer. Accordingly, the amount of the first group V element mixed into the second compound semiconductor layer can be further reduced.

Moreover, the first compound semiconductor layer is configured to be any one of an InAlAs layer and an InGaAs layer, and the second compound semiconductor layer is configured to be any one of an InP layer and an InGaP layer. Specifically, the present invention is also effective when the InP layer is formed on the InAlAs or InGaAs layer as the etch stopper layer. Moreover, the present invention can be also applied to the case where the compound semiconductor layers are reversed so that the first compound semiconductor layer is any one of an InP layer and an InGaP layer and the second compound semiconductor layer is any one of an InAlAs layer and an InGaAs layer.

Hereinafter, a description is given of the way how the present invention has been completed taking as an example a case where an InP layer is formed on an InAlAs layer.

First, after the InAlAs layer is grown on an InP substrate, focusing attention on background As molecules remaining in the growth chamber being mixed into the InP layer while the InP layer is grown, an examination was made of a relation between the amount of As mixed and etching rate of the InP layer (with As mixed). Specifically, the InP layer was grown with intensity of the As molecular beam, which corresponds to the background, varied by regulating valve opening (valve opening and closing speed) when the valve of the As molecular beam source is closed. An examination was then made of the relation at that time between the amount of As mixed and the etching rate of the InP (As mixed) layer for a phosphoric acid type etchant.

FIG. 3 shows the correlation between the amount of As mixed and the etching rate of the InP layer. For example, in the case of using a 3 nm thick InP layer as the etch stopper layer, the etching rate is required to be less than 0.1 nm/sec in order to obtain resistance to the phosphoric acid type etchant for 30 sec or more. In this case, referring to FIG. 3, the amount of As mixed in the InP layer must be suppressed to 0.05 or less by composition thereof. Desirably, the amount of As mixed in the InP layer is set to 0.02 or less. The etching rate accordingly becomes 0.05 nm/sec or less, and higher selectivity can be obtained when the InP layer is used as the etch stopper layer.

Next, an examination was made of changes in intensities of As and P molecular beams accompanied with opening and closing of the shutters and valves of the MBE apparatus. FIG. 4 is an explanatory view showing a change in intensity of the As molecular beam when the As molecular beam is supplied and stopped. FIG. 5 is an explanatory view showing a change in intensity of the P molecular beam when the P molecular beam is supplied and stopped. Supply of the molecular beams is started by opening the respective shutters and valves at 10 sec on the time axis and stopped by closing the respective shutters and valves at 30 sec.

Referring to FIG. 4, the intensity of the As molecular beam is reduced to about $\frac{1}{14}$ within about 1 second after the supply of the molecular beam is stopped and to $\frac{1}{50}$ or less within about 10 seconds. On the other hand, referring to FIG. 5, the intensity of the P molecular beam is reduced to about $\frac{1}{7}$ within about 1 second after the supply of the molecular beam is stopped and is reduced to $\frac{1}{100}$ or less within about 10 seconds. This reveals that several percent of molecules of the group V element supplied at the growth remain in the growth chamber even after the supply of the molecular beam is stopped because of the high vapor pressure of the group V element and the group V element is more likely to be mixed during the formation of the heterointerface. As for the supply of the P molecular beam, it takes a few seconds to reach desired molecular beam intensity.

Furthermore, the process in the case of forming the InP layer on the InAlAs layer was studied, and an experiment was carried out for the purpose of obtaining an optimal heterointerface forming process by experimental analysis of a relation between thickness of the transition layer of the heterointerface and the amount of As mixed. It was then found out that when the growth of the InP layer was started after the intensity of the As molecular beam reaches $\frac{1}{10}$ or less of the amount of As supplied during the growth of the InAlAs layer, the amount of As mixed was 0.05 or less in the composition, thus completing the present invention.

According to the present invention, an epitaxial growth method to form a semiconductor thin film of a group III-V compound semiconductor including a heterojunction by means of molecular beam epitaxy is configured to include: a first step of irradiating a molecular beam of at least one of group III elements and a molecular beam of a first group V element to form a first compound semiconductor layer; a second step of stopping the irradiation of the molecular beam of the group III element and the molecular beam of the first group V element to halt growth until an amount of the first group V element supplied is reduced to $\frac{1}{10}$ or less of that in the first step; and a third step of irradiating a molecular beam of at least one of the group III elements and a molecular beam of a second group V element to form a second compound semiconductor layer, which is different from the first compound semiconductor, on the first compound semiconductor layer.

Accordingly, the amount of the first group V element mixed into the second compound semiconductor layer can be not more than a predetermined value (for example, not more than 0.05 in the composition).

Consequently, when the InP layer as the etch stopper layer in the HEMT structure is formed by the epitaxial growth method of the present invention, it is possible to obtain very high selectivity and enable fine etching.

BRIEF DESCRIPTION OF THE DRAWINGS

FIG. 7 is a timing diagram showing a raw material supply procedure by an epitaxial growth method according to a conventional art.

BEST MODE FOR CARRYING OUT THE INVENTION

Hereinafter, a description is specifically given to a preferred embodiment of the present invention based on the drawings.

Figure 1:
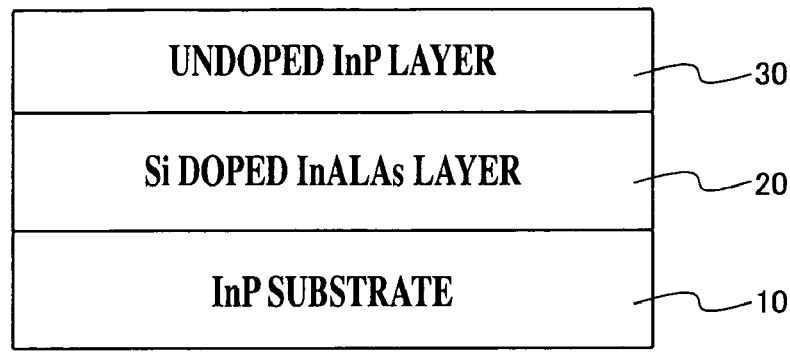
FIG. 1 is a cross-sectional view of a structure of an epitaxial growth layer forming a heterojunction interface according to the embodiment.
Figure 6:
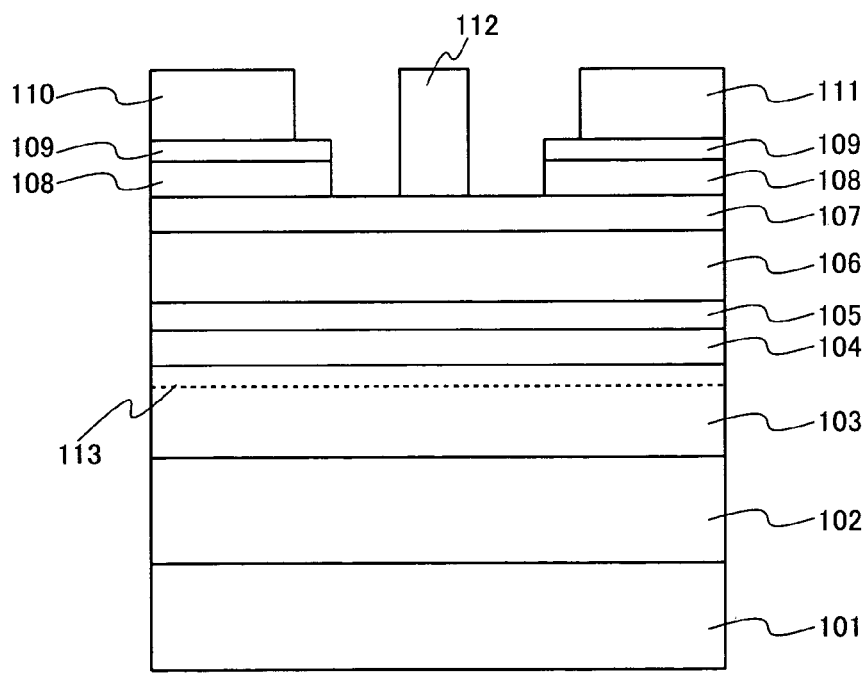
FIG. 6 is a cross-sectional view of a general HEMT structure.

FIG. 1 shows a semiconductor thin film according to this embodiment. The semiconductor thin film is formed by growing an InAlAs layer 20 on an InP substrate 10 by MBE and further growing an InP layer 30 thereon. A heterointerface between the InAlAs layer 20 and the InP layer corresponds to the heterointerface between the InAlAs layer 106 and the InP layer 107 of the HEMT structure shown in FIG. 6.

Figure 2:
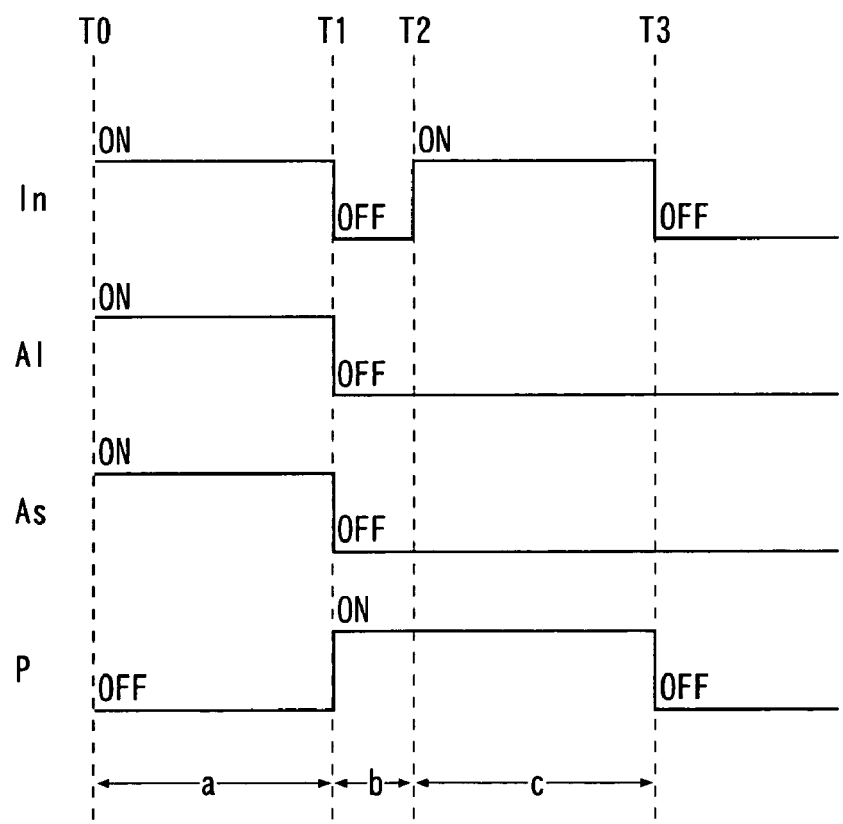
FIG. 2 is a timing diagram showing a raw material supply procedure by an epitaxial growth method according to the present invention.

FIG. 2 is a timing diagram showing a raw material supply procedure by an epitaxial growth method according to the present invention. First, irradiation of In, Al, and As molecular beams is started at time $T_0$ to grow the InAlAs layer 20 on the InP substrate 10 and then stopped at time $T_1$, thus forming the InAlAs layer 20 with a thickness 200 nm (step a).

Figure 5:
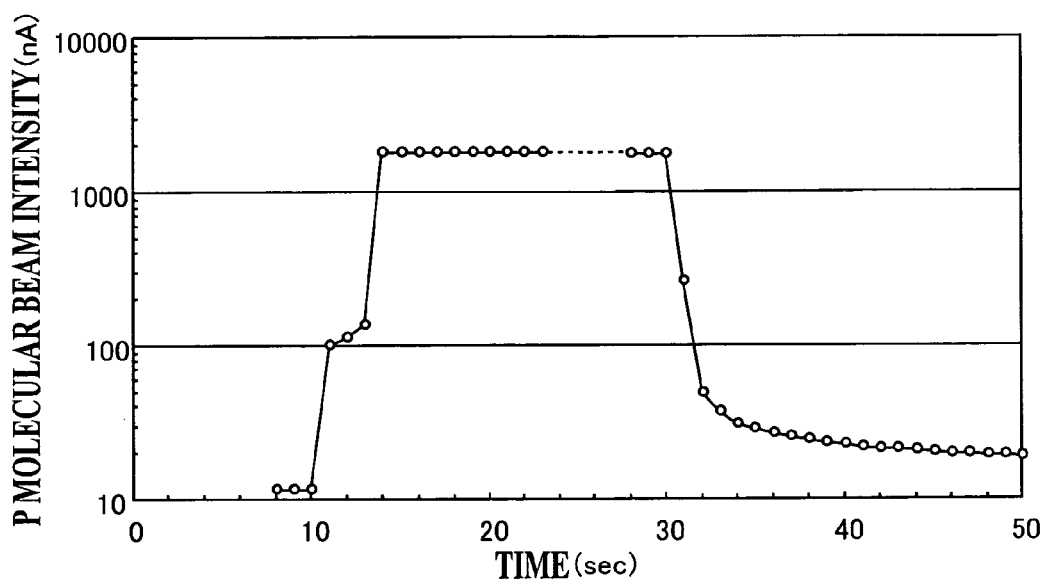
FIG. 5 is an explanatory view showing a change in intensity of a P molecular beam when the P molecular beam is supplied and stopped.

At the same time when the irradiation of the In, Al, and As molecular beams is stopped at the time $T_1$, irradiation of a P molecular beam is started, and the growth is halted for a period of time (for example, 30 seconds) until the As molecular beam intensity is reduced to ¹/₁₀ of that in the step a (step b). In this step b, the P molecular is being irradiated, but the In molecular beam is not being irradiated, so that InP layer 30 is not formed. Moreover, referring to FIG. 5, it takes several seconds for a supply of P to be increased to desired molecular beam intensity. When the irradiation of the P molecular beam is started at the same time when the As molecular beam is stopped, therefore, the P molecular beam can be supplied with a desired molecular intensity from the beginning of step c.

Subsequently, at time $T_2$, irradiation of the In molecular beam was started to start the growth of the InP layer 30, and at time $T_3$, irradiation of the In and P molecular beams were stopped, thus forming the InP layer 30 with a thickness of 3.0 nm (step c).

Figure 3:
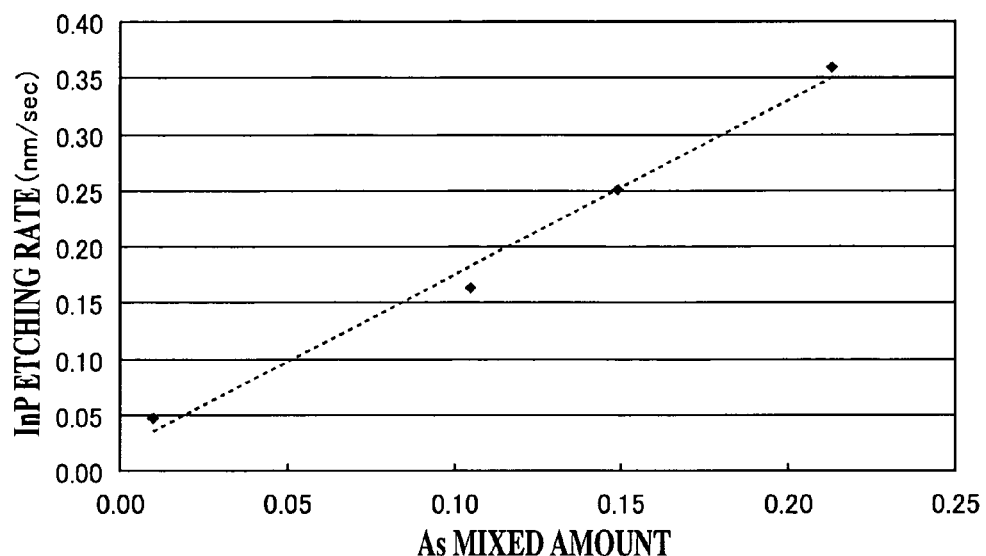
FIG. 3 is an explanatory view showing a relation between an amount of As mixed and etching rate of an InP layer.
Figure 4:
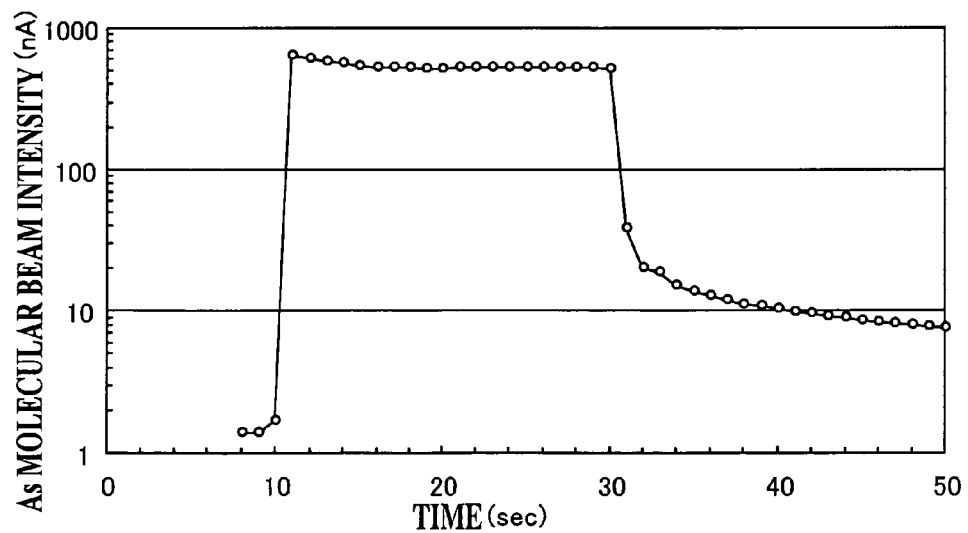
FIG. 4 is an explanatory view showing a change in intensity of an As molecular beam when the As molecular beam is supplied and stopped.

The semiconductor thin film obtained by the aforementioned way was etched by using a phosphoric acid type etchant, and etching time until the InP layer 30 was removed was measured to evaluate etching resistance of the InP layer 30. In the result, the surface of the InP layer 30 did not change within 40 seconds and was turned cloudy within 45 seconds, and the InP layer 30 was completely removed within 50 seconds. Specifically, the etching rate of the InP layer 30 according to the embodiment is 0.06 nm/sec, and referring to FIG. 3, the amount of As mixed in the InP layer 30 was estimated to be about 0.025 in the composition. As described above, with the epitaxial growth method according to the present invention, the amount of As mixed into the InP layer 30 is reduced enough to a level not affecting the etching resistance of the InP layer 30. Accordingly, the InP layer 30 as the etch stopper layer provides very high selectivity.

Next, as a comparative example, a description is given of a semiconductor thin film formed by a conventional art. FIG. 7 is a timing diagram showing a raw material supply procedure by an epitaxial growth method according to the conventional art.

First, at time $t_o$, irradiation of the In, Al, and As molecular beams was started to grow the InAlAs layer 20 on the InP substrate 10. At time $t_1$, the irradiation of the Al and As molecular beams was stopped, thus forming the InAlAs layer 20 with a thickness of 200 nm (step A). At this time, the In molecular beam was not stopped and continuously irradiated.

At the same time when irradiation of the Al and As molecular beams was stopped at the time $t_1$, the irradiation of the P molecular beam was started to grow the InP layer 30. At time $t_2$, the irradiation of the In and P molecular beams was stopped, thus forming the InP layer 30 with a thickness of 3.0 nm (step B).

The semiconductor thin film obtained by the aforementioned way was etched by using a phosphoric acid type etchant, and the etching time until the InP layer 30 was removed was measured to evaluate the etching resistance. In the result, the InP layer was completely removed by etching for 20 seconds. Specifically, the etching rate of the InP layer according to the comparative example was 0.15 nm/sec, and referring to FIG. 3, the amount of As mixed into the InP layer 30 was estimated to be about 0.084 in the composition. In the conventional art, the supply of the In molecular beam is not stopped, and the irradiation of the P molecular beam is started immediately after the irradiation of the As molecular beam is stopped to continuously form the InAlAs layer 20 and InP layer 30. It was therefore considered that As remaining in the growth room was mixed into the InP layer 30 to reduce the etching resistance of the InP layer 30.

As described above, when the heterointerface between the InAlAs layer and the InP layer is formed in the present invention, the epitaxial growth is temporarily stopped according to attenuation of the intensity of the As molecular beam. It is therefore possible to prevent the group V element (As), which is unnecessary in the InP layer, from being mixed into the InP layer and thus form a sharp heterointerface. In the case of using the InP layer as the etch stopper layer, even when the InP layer is formed to be very thin, the characteristics (etching resistance) thereof is not degraded, and the InP layer provides high selectivity.

Hereinabove, the present invention made by the inventor is specifically described based on the embodiment. However, the present invention is not limited to the aforementioned embodiment and can be modified without departing from the scope of the invention. For example, in the embodiment, the description is given of the case where InP layer is formed on the InAlAs layer. However, when the InGaAs layer and the InGaP layer were formed instead of the InAlAs layer and the InP layer, respectively, the same effect can be obtained. Moreover, when the formed layers are inversely structured, for example, when the InAlAs or InGaAs layer is formed on the InP or InGaP layer, the same effect can be obtained.

INDUSTRIAL APPLICABILITY

The present invention can be utilized in a technology to form a group III-V compound semiconductor thin film including a heterointerface between layers containing different group V elements, for example, production of a high electron mobility transistor (HEMT) using an InP layer as the etch stopper layer (etching control layer).

The invention claimed is:

1. An epitaxial growth method to form a semiconductor thin film including a heterojunction of a group III-V compound semiconductor by means of molecular beam epitaxy, the method comprising:
   a first step of irradiating a molecular beam of at least one of group III elements and a molecular beam of a first group V element to form a first compound semiconductor layer;
   a second step of stopping the irradiation of the molecular beam of the group III element and the molecular beam of the first group V element, starting an irradiation of a molecular beam of a second group V element at the same time, and halting growth for a period of time until a remaining molecular beam intensity of the first group V element is reduced to be in the range of 0.01 to 0.1 of that in the first step; and
   a third step of restarting an irradiation of a molecular beam of at least one of the group III elements to form an etch stopper layer on the first compound semiconductor layer, the etch stopper layer being composed of the second compound semiconductor layer which is different from the first compound semiconductor,
   wherein the semiconductor thin film comprises a high electron mobility transistor structure.

2. An epitaxial growth method to form a semiconductor thin film including a heterojunction of a group III-V compound semiconductor by means of molecular beam epitaxy, the method comprising:
   a first step of irradiating a molecular beam of at least one of group III elements and a molecular beam of a first group V element to form a first compound semiconductor layer;
   a second step of stopping the irradiation of the molecular beam of the group III element and the molecular beam of the first group V element, starting an irradiation of a molecular beam of a second group V element at the same time, and halting growth for a period of time until a remaining molecular beam intensity of the first group V element is reduced to be in the range of 0.01 to 0.1 of that in the first step; and
   a third step of further restarting an irradiation of a molecular beam of at least one of the group III elements in addition to continuously irradiating the molecular beam of the second group V element to form an etch stopper layer on the first compound semiconductor layer, the etch stopper layer being composed of the second compound semiconductor layer which is different from the first compound semiconductor,
   wherein the semiconductor thin film comprises a high electron mobility transistor structure.

3. The epitaxial growth method as claimed in claim 1, wherein the first compound semiconductor layer is any one of an InAlAs layer and an InGaAs layer and the second compound semiconductor layer is any one of an InP layer and an InGaP layer.

4. The epitaxial growth method as claimed in claim 2, wherein the first compound semiconductor layer is any one of an InAlAs layer and an InGaAs layer and the second compound semiconductor layer is any one of an InP layer and an InGaP layer.

* * * * *